(12) United States Patent
Cho

(10) Patent No.: US 7,000,648 B2
(45) Date of Patent: Feb. 21, 2006

(54) DEVICE PICKER IN HANDLER

(75) Inventor: Cheol Hoon Cho, Kyonggi-do (KR)

(73) Assignee: Mirae Corporation, Chunan-Si (KR)

( * ) Notice: Subject to any disclaimer, the term of this patent is extended or adjusted under 35 U.S.C. 154(b) by 521 days.

(21) Appl. No.: 10/292,584

(22) Filed: Nov. 13, 2002

(65) Prior Publication Data

US 2003/0102879 A1    Jun. 5, 2003

(30) Foreign Application Priority Data

Nov. 19, 2001    (KR) ...................... 10-2001-0071844

(51) Int. Cl.
*D03D 49/36* (2006.01)
(52) U.S. Cl. ...................................... 139/159; 714/825
(58) Field of Classification Search ........... 414/416.09, 414/404, 752.1, 618; 209/573; 294/65; 324/754, 158.1; 714/825; 139/159
See application file for complete search history.

(56) References Cited

U.S. PATENT DOCUMENTS

| | | | | |
|---|---|---|---|---|
| 5,007,788 A | * | 4/1991 | Asano et al. | 414/416.09 |
| 5,290,134 A | * | 3/1994 | Baba | 414/404 |
| 6,346,682 B1 | * | 2/2002 | Kim et al. | 290/573 |
| 6,352,402 B1 | * | 3/2002 | Hwang et al. | 414/752.1 |
| 6,439,631 B1 | * | 8/2002 | Kress | 294/65 |

* cited by examiner

*Primary Examiner*—David Ton
(74) *Attorney, Agent, or Firm*—Fleshner & Kim, LLP.

(57) ABSTRACT

A device picker in a handler includes a vertical plate installed on the installation rest to be movable, a plurality of variable pitch blocks installed in parallel with each other on a lower end of the vertical plate through guide members to be movable in right and left directions to enable right/left pitch adjustment, a pair of pickup members installed on front and rear sides of each of the variable pitch blocks through guide members to ascend/descend, respectively, the pickup members coupled with each other to interoperate in opposite directions to pick up and release the devices alternately, a block driving means for moving the variable pitch blocks in a lateral direction, and a pickup member driving means for interoperating the pickup members to move upward and downward in opposite directions, respecively.

5 Claims, 6 Drawing Sheets

DEVICE PICKER IN HANDLER

This application claims the benefit of the Korean Application No. P2001-71844 filed on Nov. 19, 2001, which is hereby incorporated by reference.

BACKGROUND OF THE INVENTION

1. Field of the Invention

The present invention relates to a picker of picking up a device for transport in a handler, and more particularly, to a device picker in a handler for picking up a plurality of pairs of devices simultaneously at one side of the handler to transfer to load them to the other side.

2. Discussion of the Related Art

Generally, devices such as memory semiconductor devices, n-memory semiconductor devices, and the like and modules having such devices arranged on a single substrate to construct circuits are inspected by various tests for shipment. The handler is an apparatus used for testing the devices and module RAMs automatically.

Most of the handlers carries out not only general performance test at room temperature but also high and low temperature tests for checking whether the devices and module RAMs operate normally by building up environments of extremely high or low temperature through an electric heater or liquefied nitrogen jetting system in an airtight chamber.

FIG. 1 illustrates a diagram of a handler for testing devices such as memory semiconductor packages.

Referring to FIG. 1, a loading stacker 10, on which user trays receiving a plurality of devices to be tested are loaded, is installed in a front part of the handler. And, an unloading stacker 20 is installed at one side of the loading stacker 10 so that the devices are classified by test results after completion of the tests to be received in the user trays.

Buffer units 40, on which the devices transferred from the loading stacker 10 are temporarily loaded, are installed to move back and forth at both sides of a middle part of the handler.

And, an exchange unit 50 is installed between the buffer units 40. In the exchange unit 50, carried out are a process of transferring devices of the buffer unit 40 to be tested and reloading the transferred devices on a test trays T and another process of loading the test-completed devices of the test trays on the buffer units 40.

Between the handler front part on which the loading and unloading stackers 10 and 20 are arranged and the handler middle part on which the exchange and buffer units 50 and 40 are arranged, first and second pickers 31 and 32 moving linearly along an X-Y axis to pick up to transport the devices are installed. The first picker 31 moves between the loading and unloading stackers 10 and 20 and the buffer units 4 to pick up to transport the devices, and the second picker 32 moves between the buffer units and exchange unit 50 to pick up to transport the devices.

In a rear part of the handler, installed is a test site 70 for testing the performance of the devices at a predetermined temperature by conveying the test trays T having the devices loaded thereon sequentially after high or low temperature test environments have been built in a plurality of separate airtight chambers.

However, the first and second pickers 31 and 32 of the above-constituted handler are designed to pick up to transport a pair of devices only each time, thereby reducing test efficiency.

If the number of the pickup means of each picker is increased, the overall constitution of the pickers becomes complicated to have difficulty in controlling malfunction and maintenance of the apparatus.

SUMMARY OF THE INVENTION

Accordingly, the present invention is directed to a device picker in a handler that substantially obviates one or more problems due to limitations and disadvantages of the related art.

An object of the present invention is to provide a device picker in a handler enabling to improve test efficiency by picking up to transport a plurality of device pairs simultaneously without complicating the constitution of the device picker.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in an apparatus mounted an installation rest installed on a body of a handler to move horizontally to pick up to transport devices from one side of the handler to the other side of the handler, a device picker in the handler according to the present invention includes a vertical plate installed on the installation rest to be movable, a plurality of variable pitch blocks installed in parallel with each other on a lower end of the vertical plate through guide members to be movable in right and left directions to enable right/left pitch adjustment, a pair of pickup members installed on front and rear sides of each of the variable pitch blocks through guide members to ascend/descend, respectively, the pickup members coupled with each other to interoperate in opposite directions to pick up and release the devices alternately, a block driving means for moving the variable pitch blocks in a lateral direction, and a pickup member driving means for interoperating the pickup members to move upward and downward in opposite directions respectively.

Preferably, the block driving means includes an electric motor installed on the vertical plate, a pinion gear unit coupled with the electric motor to revolve, and a rack gear unit fixed to an upper end of the variable pitch block to gear into the pinion gear unit to move straight in the lateral direction.

Preferably, the pickup member driving means includes driving and driven pulleys installed at upper and lower ends of one side of each of the variable pitch blocks to revolve, respectively, an electric motor revolving the driving pulley, a belt coupled across with the driving and driven pulleys to be driven upward and downward by revolution of the driving pulley, a front connecting bracket having one end coupled with one side of the belt and the other end coupled with the pickup member in the front side, and a rear connecting bracket having one end coupled with the other side of the belt and the other end coupled with the pickup member in the rear side.

More preferably, a vacuum nozzle absorbing a device surface by vacuum pressure is formed at a lower end of each of the pickup members.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In order to provide easy comprehension of the present invention, the following description deals with the case that a device picker according to the present invention is applied to a second picker of a handler only. Yet, the present invention is not intended to limit the application but is applicable to a first picker of the handler or pickers in other kind of handlers similarly as well.

FIGS. 2 to 6 illustrate a structure of a device picker according to the present invention.

Figure 1:
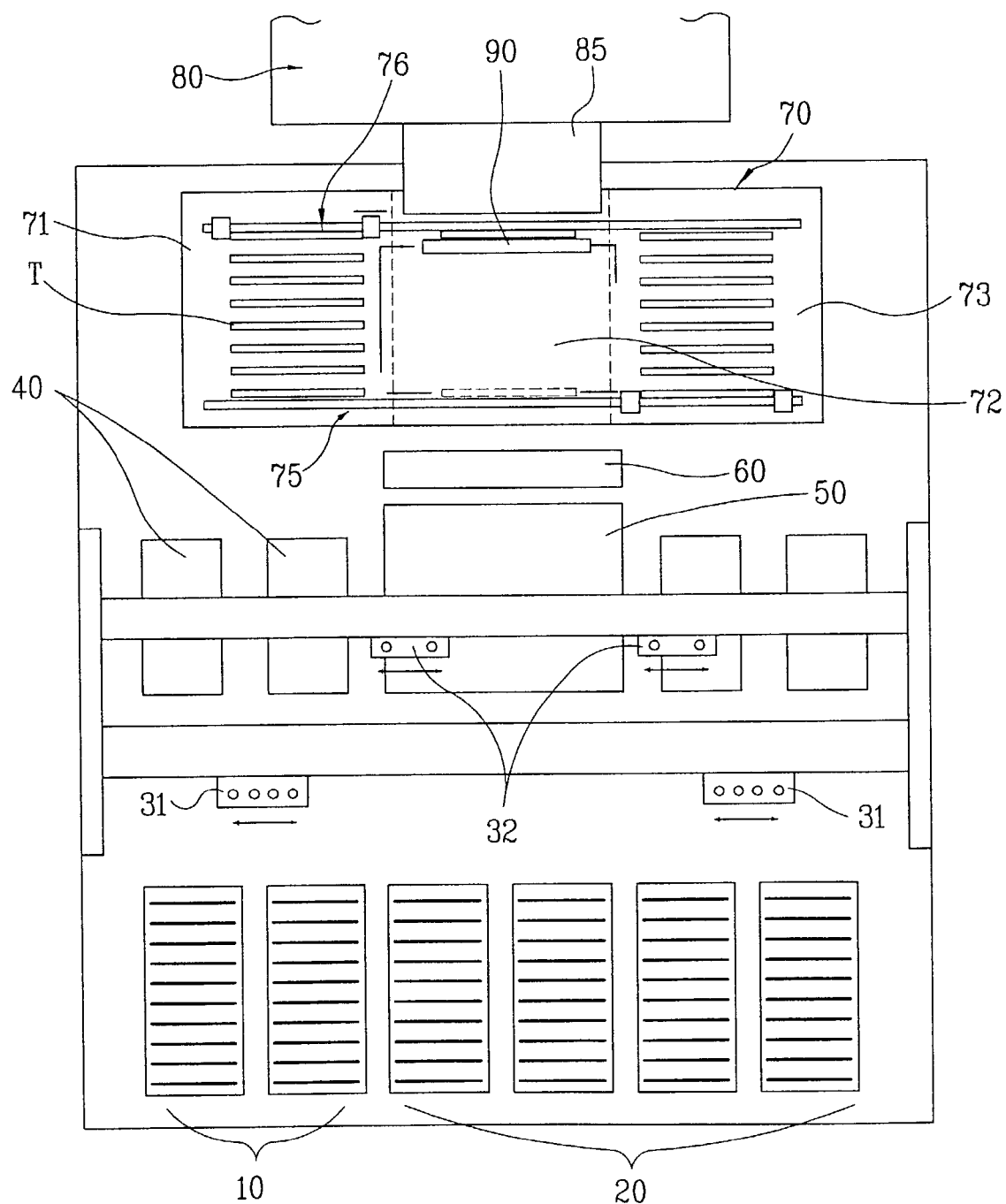
FIG. 1 illustrates a schematic layout of a general handler.
Figure 2:
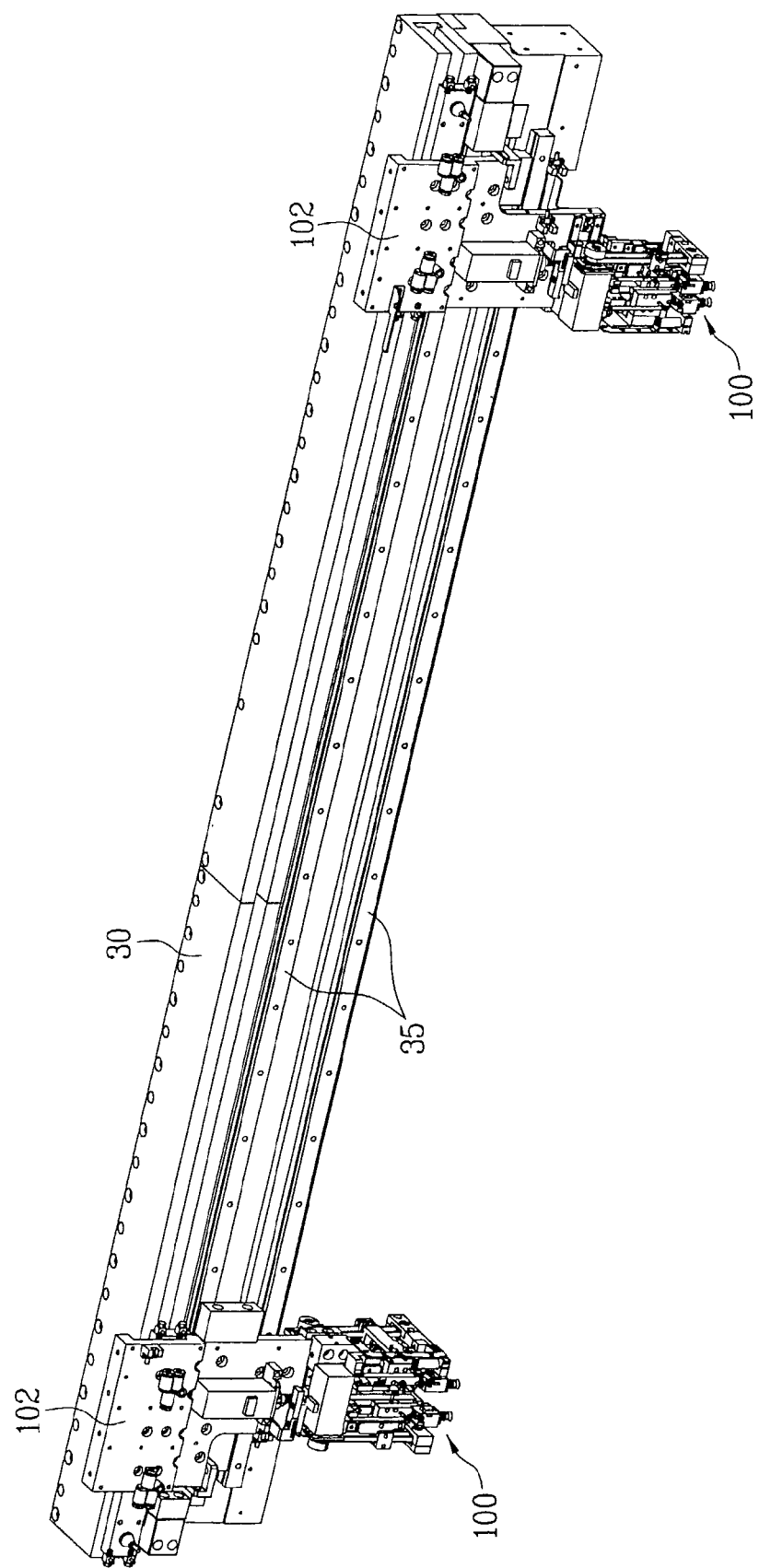
FIG. 2 illustrates a bird's-eye view of a handler having a device picker according to the present invention.
Figure 3:
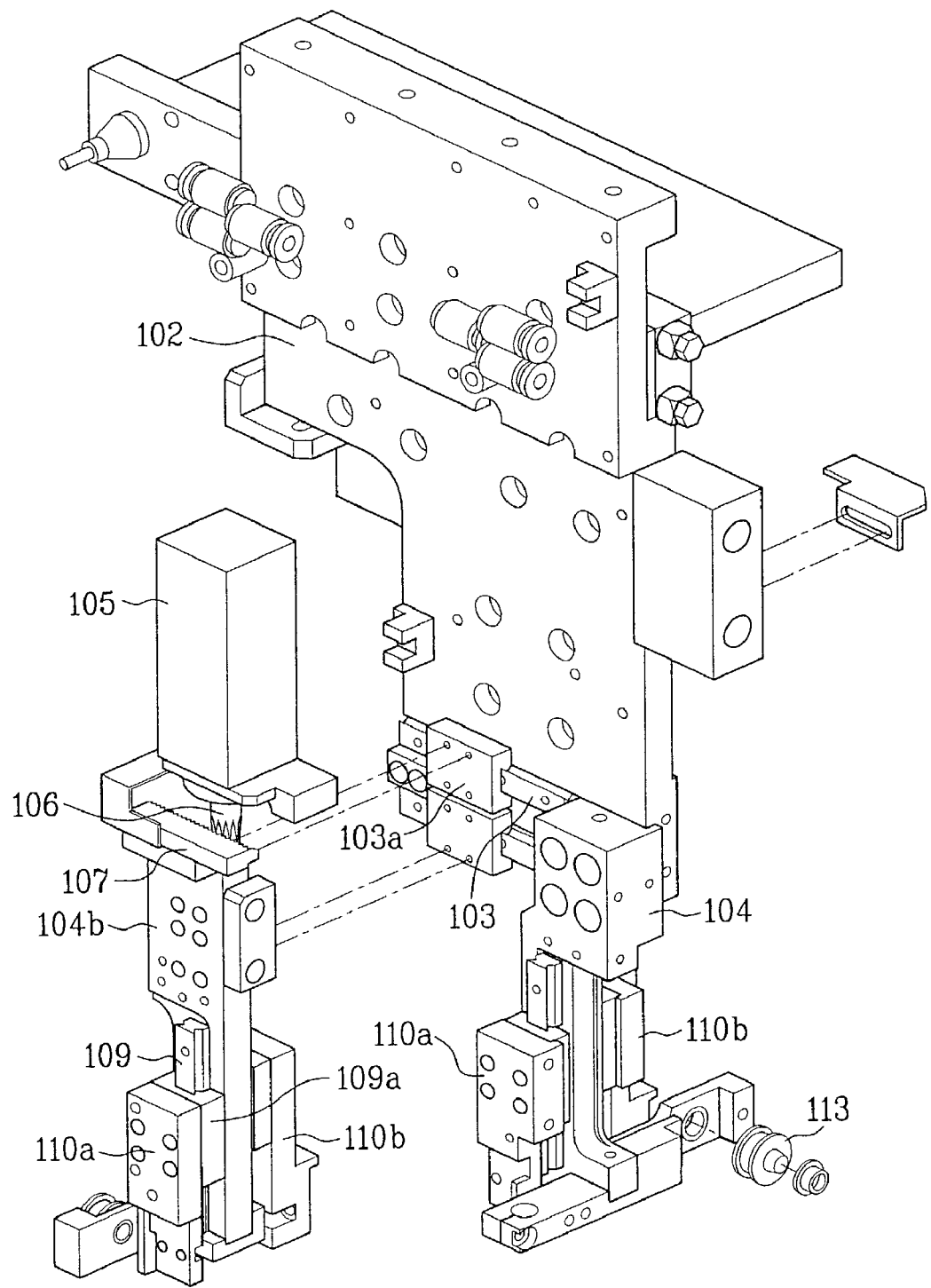
FIG. 3 illustrates a bird's-eye view of an assembly of a device picker having components disassembled in part according to the present invention.
Figure 4:
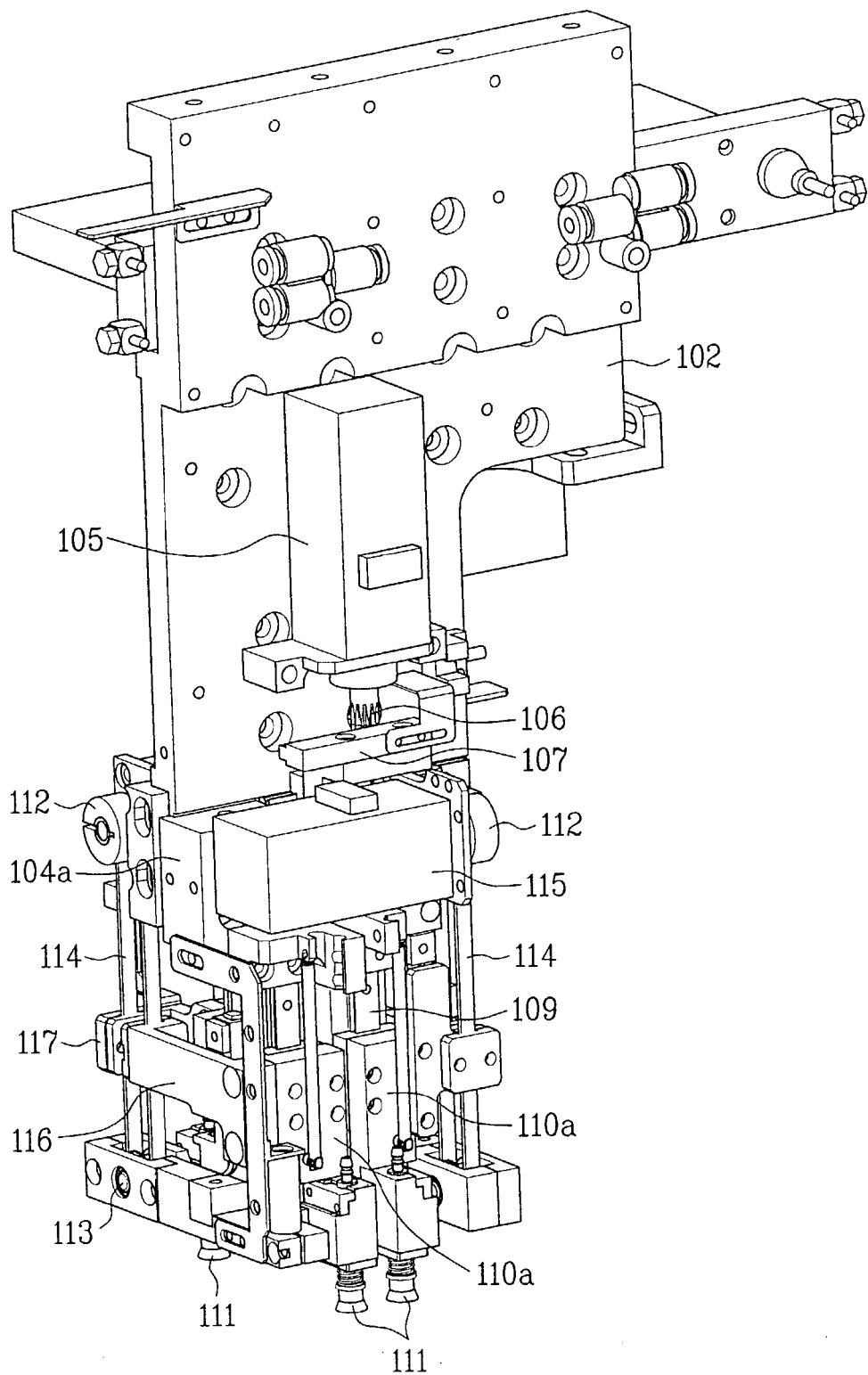
FIG. 4 illustrates a bird's-eye view of an assembled device picker according to the present invention.
Figure 5:
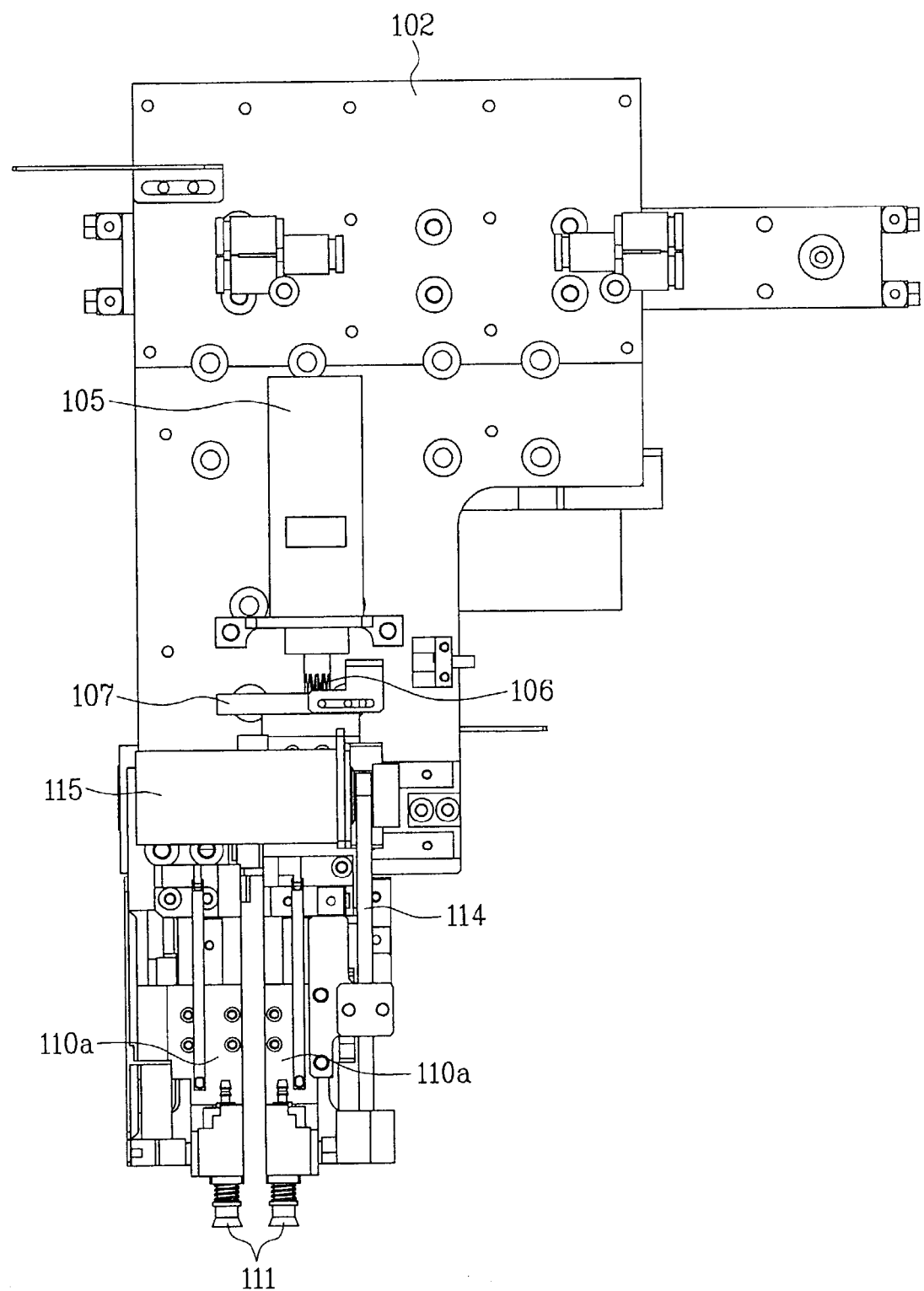
FIG. 5 illustrates a front view of the device picker in FIG. 4.
Figure 6:
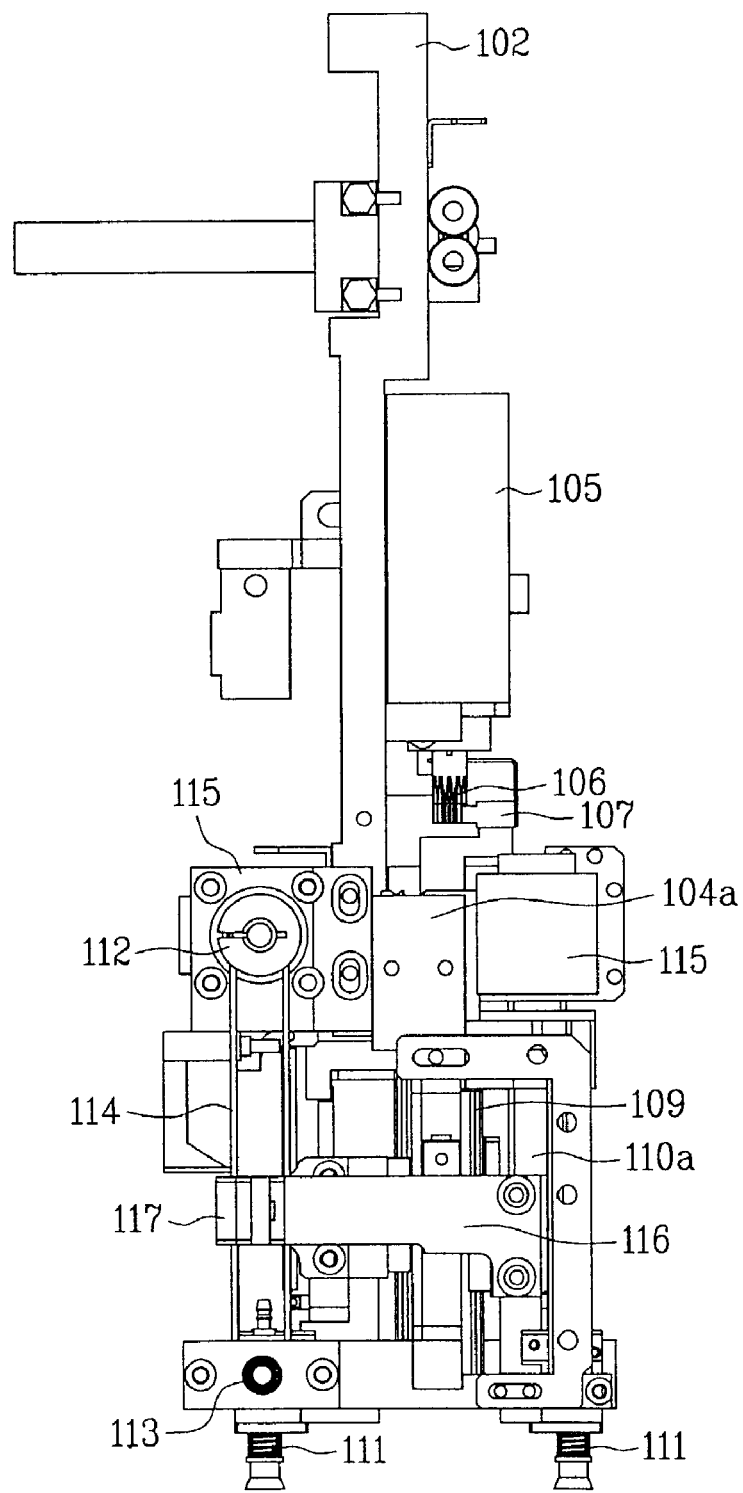
FIG. 6 illustrates a side view of the device picker in FIG. 4.

First of all, each device picker 100 according to the present invention slides along an installation rest 30 across right and left sides over buffer units (cf. '40' in FIG. 1) and an exchange unit 50 to move horizontally, and carries out device transport and loading between the buffer and exchange units 40 and 50.

The device picker 100 includes a vertical plate 102 coupled with the installation rest 30 through an LM block (not shown in the drawing) of an LM guide 103 and a pair of variable pitch blocks 104a and 104b installed at a lower end of the vertical plate 102 in parallel with each other. The variable pitch block 104a is connected to be fixed to the vertical plate 102 and the other variable pitch block 104b is coupled with the LM block 103a of the LM guide 103 installed at the vertical plate 102. Thus, the variable pitch blocks 104a and 104b move in right and left directions to adjust an interval between right and left sides, i.e. a pitch.

An electric motor 105 is installed over the vertical plate 102 as a driving means for moving the variable pitch block 104 in a lateral direction. A pinion gear unit 106 is coupled with a lower part of the electric motor 105 to receive a driving force of the electric motor 105, and gears into a rack gear unit 107 fixed to an upper end of the variable pitch block 104b. As the pinion gear unit 106 starts to revolve by the electric motor 105, the rack gear unit 107 moves straight right and left to move the variable pitch block 104b right and left.

Meanwhile, pickup members 110a and 110b are coupled with front and rear sides of each of the variable pitch blocks 104a and 104b to pick up devices through an LM block 109a of an LM guide 109, respectively. And, each of the pickup members 110a and 110b has a vacuum nozzle 111 at its lower end to absorb a device by vacuum pressure.

The pickup members 110a and 110b installed in the front and rear sides of each of the variable pitch blocks 104a and 104b are coupled to interoperate reciprocally by a driving means, and are constructed to carry out rise and fall movement in opposite directions, respectively. A driving pulley 112 and a driven pulley 113 are installed to turn at outer upper and lower ends of each of the variable pitch blocks 104a and 104b. The driving and driven pulleys 112 and 113 are coupled with each other through a belt 114. And, the driving pulley 112 is coupled with an electric motor 115 to receive a turning force.

Moreover, one end of a front connecting bracket 116 is connected to the pickup member 110a at the front side and the other end of the front connecting bracket 116 is connected to one side of the belt 114. One end of a rear connecting bracket 117 is connected to the other pickup member 110b at the rear side and the other end of the rear connecting bracket 117 is connected to the other side of the belt 114.

Hence, if the driving pulley 112 starts to turn by the electric motor 115, the belt 114 coupled with the driving pulley 112 is driven upward and downward to move upward and downward the pickup members 110a and 110b, which are coupled with the belt 114 through the connecting brackets 116 and 117, at the front and rear sides along the opposite moving directions of the belt 114, respectively.

As mentioned in the foregoing description, the pickup members 110a and 110b in a front line of the device picker and those in a rear line of the device picker go up and come down alternately to pick up devices, respectively. Namely, when the pickup members 110a at the front side of each of the variable pitch blocks 104a and 104b go up or come down together, the other pickup members at the rear side come down or go up together. Thus, the pickup members 110a and 110b carry out the operation of picking up the devices.

The above-constituted device picker according to the present invention operates in the following manner.

First of all, once the first picker 31 of the handler brings a device to be tested to the buffer unit 40 from the tray (not shown in the drawing) of the loading stacker 10, the device picker 100 of the present invention functioning as a second picker is aligned right over the buffer unit 40 to pick up the device. Subsequently, the electric motor 115 is driven to make the pickup member 110a in the front line go down so that the vacuum nozzle 111 absorbs the device by suction. The electric motor 115 is then driven inversely to make the pickup member 110a go up. In this case, as mentioned in the foregoing description, the other pickup members 110b in the rear line carry out the movement opposite to that of the pickup members 110a in the front line.

After the buffer unit 40 has moved away with a predetermined distance, i.e. to a location that the pickup member 110b in the rear line enables to pick up the next device of the buffer unit 40, the electric motor 115 operates to make the pickup member 110b in the rear line go down so that the vacuum nozzle 111 absorbs the device by suction. The electric motor 115 then operates inversely to make the pickup member 110b go up.

In this case, the pickup member 110a in the front line and the other pickup member 110b in the rear line are preferably disposed at the same level to prevent collision with other structures of the handler while being transported.

Thereafter, while the device picker 100 is picking up the device, the vertical plate 102 is transferred to the exchange unit 50 along the installation rest 30 by an additional driving means such as linear motor, ball screw (not shown in the drawing), or the like to reload a device on the test tray (not shown in the drawing). In this case, operation of the device picker 100 is carried out in the above-explained manner similarly.

The operation of transporting the test-completed device received in the test tray T of the exchange unit 50 to the buffer unit 40 follows the operation of the device picker 100, thereby being skipped in this description.

Meanwhile, if the species of the devices to be tested in the handler is changed, the species of the trays receiving the devices are changed as well as a lattice size of the tray having the corresponding device put thereon is changed. Hence, the device on the tray fails to be aligned with the pickup members 110a and 110b of the device picker 100.

In such a case, an interval between the pickup members 110a and 10b of the device picker should be adjusted in a manner that one pitch adjustment in a lateral direction is performed by moving the variable pitch block 104b while the other pitch adjustment in a front/rear direction is performed by adjusting forward/backward displacement of the buffer unit 40 on the handler body.

Hence, if the electric motor 105 is operated as much as a setup value to turn the pinion gear unit 106, the rack gear unit 107 is moved with a distance that is given. Thus, the interval between the pickup members 110a and 10b is adjusted to complete alignment.

Accordingly, the present invention picks up to transport at least four devices backward or forward simultaneously as well as maintains a simple structure of the device picker, thereby enabling to improve test efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. In an apparatus mounted an installation rest installed on a body of a handler to move horizontally to pick up to transport devices from one side of the handler to the other side of the handler, a device picker in the handler, comprising:
   a vertical plate installed on the installation rest to be movable;
   a plurality of variable pitch blocks installed in parallel with each other on a lower end of the vertical plate through guide members to be movable in right and left directions to enable right/left pitch adjustment;
   a pair of pickup members installed on front and rear sides of each of the variable pitch blocks through guide members to ascend/descend, respectively, the pickup members coupled with each other to interoperate in opposite directions to pick up and release the devices alternately;
   a block driving means for moving the variable pitch blocks in a lateral direction; and
   a pickup member driving means for interoperating the pickup members to move upward and downward in opposite directions respectively.

2. The device picker of claim 1, the block driving means comprising:
   an electric motor installed on the vertical plate;
   a pinion gear unit coupled with the electric motor to revolve; and
   a rack gear unit fixed to an upper end of the variable pitch block to gear into the pinion gear unit to move straight in the lateral direction.

3. The device picker of claim 2, the pickup member driving means, comprising:
   driving and driven pulleys installed at upper and lower ends of one side of each of the variable pitch blocks to revolve, respectively;
   an electric motor revolving the driving pulley;
   a belt coupled across with the driving and driven pulleys to be driven upward and downward by revolution of the driving pulley;
   a front connecting bracket having one end coupled with one side of the belt and the other end coupled with the pickup member in the front side; and
   a rear connecting bracket having one end coupled with the other side of the belt and the other end coupled with the pickup member in the rear side.

4. The device picker of claim 2, wherein a vacuum nozzle absorbing a device surface by vacuum pressure is formed at a lower end of each of the pickup members.

5. The device picker of claim 1, the pickup member driving means, comprising:
   driving and driven pulleys installed at upper and lower ends of one side of each of the variable pitch blocks to revolve, respectively;
   an electric motor revolving the driving pulley;
   a belt coupled across with the driving and driven pulleys to be driven upward and downward by revolution of the driving pulley;
   a front connecting bracket having one end coupled with one side of the belt and the other end coupled with the pickup member in the front side; and
   a rear connecting bracket having one end coupled with the other side of the belt and the other end coupled with the pickup member in the rear side.

* * * * *